United States Patent
Joshi et al.

(10) Patent No.: US 7,439,613 B2
(45) Date of Patent: Oct. 21, 2008

(54) SUBSTRATE BASED UNMOLDED PACKAGE

(75) Inventors: Rajeev Joshi, Cupertino, CA (US);
Jonathan A. Noquil, Surigao del Sur (PH); Consuelo N. Tangpuz, Lapulapu (PH)

(73) Assignee: Fairchild Semicondcutor Corporation, South Portland, ME (US)

( * ) Notice: Subject to any disclaimer, the term of this patent is extended or adjusted under 35 U.S.C. 154(b) by 0 days.

(21) Appl. No.: 10/841,656

(22) Filed: May 6, 2004

(65) Prior Publication Data

US 2004/0207052 A1    Oct. 21, 2004

Related U.S. Application Data

(63) Continuation-in-part of application No. 10/233,248, filed on Aug. 30, 2002, now Pat. No. 7,061,077.

(51) Int. Cl.
*H01L 21/44* (2006.01)

(52) U.S. Cl. .................................. 257/678; 257/690
(58) Field of Classification Search ............... None
See application file for complete search history.

(56) References Cited

U.S. PATENT DOCUMENTS

| | | | |
|---|---|---|---|
| 3,982,317 A | 9/1976 | Eysermans | |
| 4,769,709 A | 9/1988 | Van De Steeg | |
| 5,172,214 A | 12/1992 | Casto | |
| 5,309,018 A | 5/1994 | Shibata | |
| 5,313,092 A | 5/1994 | Tsuruta et al. | |
| 5,450,283 A | 9/1995 | Lin et al. | |
| 5,528,075 A | 6/1996 | Burns | |
| 5,537,075 A | 7/1996 | Miyazaki | |
| 5,637,916 A | 6/1997 | Joshi | |
| 5,765,280 A | 6/1998 | Joshi | |
| 5,777,386 A | 7/1998 | Higashi et al. | |
| 5,789,809 A | 8/1998 | Joshi | |
| 6,133,634 A | 10/2000 | Joshi | |
| 6,143,981 A | 11/2000 | Glenn | |
| 6,229,200 B1 | 5/2001 | Mclellan et al. | |
| 6,242,281 B1 | 6/2001 | Mclellan et al. | |
| 6,249,041 B1 * | 6/2001 | Kasem et al. | 257/666 |
| 6,294,403 B1 | 9/2001 | Joshi | |
| 6,307,272 B1 * | 10/2001 | Takahashi et al. | 257/787 |
| 6,355,502 B1 | 3/2002 | Keng et al. | |
| 6,384,472 B1 | 5/2002 | Huang | |
| 6,461,900 B1 * | 10/2002 | Sundaresan et al. | 438/156 |

(Continued)

OTHER PUBLICATIONS

U.S. Appl. No. 11/180,367, Joshi.

(Continued)

*Primary Examiner*—Leonardo Andújar
(74) *Attorney, Agent, or Firm*—Townsend and Townsend and Crew LLP

(57) ABSTRACT

A semiconductor die package is disclosed. In one embodiment, the semiconductor die package has a substrate. It includes (i) a leadframe structure including a die attach region with a die attach surface and a lead having a lead surface, and (ii) a molding material. The die attach surface and the lead surface are exposed through the molding material. A semiconductor die is on the die attach region, and the semiconductor die is electrically coupled to the lead. The die attach surface and the lead surface can be in different planes.

15 Claims, 7 Drawing Sheets

U.S. PATENT DOCUMENTS

| | | |
|---|---|---|
| 6,469,384 B2 | 10/2002 | Joshi |
| 6,476,469 B2 * | 11/2002 | Hung et al. ................ 257/676 |
| 6,479,888 B1 * | 11/2002 | Hirashima et al. .......... 257/673 |
| 6,489,678 B1 | 12/2002 | Joshi |
| 6,518,653 B1 | 2/2003 | Takagi |
| 6,630,726 B1 | 10/2003 | Crowley et al. |
| 6,633,030 B2 | 10/2003 | Joshi |
| 6,661,082 B1 | 12/2003 | Granada et al. |
| 6,737,750 B1 | 5/2004 | Hoffman et al. |
| 6,893,901 B2 | 5/2005 | Madrid |
| 7,196,313 B2 | 3/2007 | Quinones et al. |
| 2002/0066950 A1 | 6/2002 | Joshi |
| 2002/0066959 A1 | 6/2002 | Joshi |
| 2002/0074147 A1 | 6/2002 | Tan et al. |
| 2002/0084511 A1 | 7/2002 | Konishi |
| 2002/0093094 A1 | 7/2002 | Takagawa et al. |
| 2002/0100962 A1 | 8/2002 | Joshi |
| 2002/0163070 A1 | 11/2002 | Choi |
| 2002/0167075 A1 | 11/2002 | Madrid |
| 2002/0177256 A1 | 11/2002 | Lee |
| 2003/0062601 A1 | 4/2003 | Harnden et al. |
| 2003/0146508 A1 | 8/2003 | Chen |
| 2004/0063240 A1 * | 4/2004 | Madrid et al. ............... 438/106 |

OTHER PUBLICATIONS

U.S. Appl. No. 11/180,405, Joshi.

U.S. Appl. No. 09/944,717, filed Aug. 31, 2001, Joshi.

* cited by examiner

SUBSTRATE BASED UNMOLDED PACKAGE

CROSS-REFERENCE TO RELATED APPLICATIONS

This application is a continuation-in-part application of U.S. patent application Ser. No. 10/233,248, filed on Aug. 30, 2002, which is herein incorporated by reference in its entirety for all purposes.

BACKGROUND OF THE INVENTION

Some conventional semiconductor die packages use ceramic substrates. In one example, a ceramic substrate is metallized and has conductive lines and lands. A semiconductor die is mounted on the ceramic substrate to form a semiconductor die package. This semiconductor die package is then mounted on a circuit board.

Other conventional semiconductor packages use leadframes. In one example, a semiconductor die is mounted to a leadframe with leads. Wires couple the semiconductor die to the leads. The wires, the semiconductor die and then the most of the leadframe (except for the leads that extend outward) are then encapsulated in a molding material. The molding material is then shaped. The formed semiconductor die package can then be mounted onto a circuit board.

While such semiconductor packages are useful, improvements could be made. For example, semiconductor die packages that use ceramic substrates are relatively expensive to make. Compared to many polymeric materials, ceramic materials are expensive. In addition, both types of semiconductor die packages mentioned above are relatively thick. It would be desirable if the thickness of a semiconductor die package could be reduced. As consumer electronics (e.g., cell phones, laptop computers, etc.) continue to decrease in size, there is an ever increasing demand for thinner electronic devices and thinner electronic components.

Embodiments of the invention address the above problems and other problems individually and collectively.

SUMMARY OF THE INVENTION

Embodiments of the invention are directed to semiconductor packages including substrates and semiconductor dies, and methods for forming the same.

One embodiment of the invention is directed to a semiconductor die package comprising: (a) a substrate comprising (i) a leadframe structure including a die attach region with a die attach surface and a lead having a lead surface, and (ii) a molding material, wherein the molding material is formed around the lead surface and defines a region for attachment of a conductive structure; and (b) a semiconductor die on the die attach region, wherein the semiconductor die is electrically coupled to the lead.

Another embodiment of the invention is directed to a semiconductor die package comprising: (a) a substrate comprising (i) a leadframe structure including a die attach region with a die attach surface and a lead having a lead surface, wherein the die attach surface and the lead surface are in different planes, and (ii) a molding material on the leadframe structure, wherein the die attach surface and the lead surface are free of the molding material; and (b) a semiconductor die on the die attach region, wherein the semiconductor die is electrically coupled to the die attach surface.

Another embodiment of the invention is directed to a method comprising: providing a leadframe structure including a die attach region with a die attach surface and a lead including a lead surface; stamping the leadframe structure so that the lead surface and the die attach surface lie in different planes; attaching a semiconductor die to the die attach region; and forming a molding material around the leadframe structure and on the lead and around the lead surface to thereby expose the lead surface; and placing a conductive structure on the lead surface.

These and other embodiments of the invention are described in further detail below.

DETAILED DESCRIPTION

Figure 1:
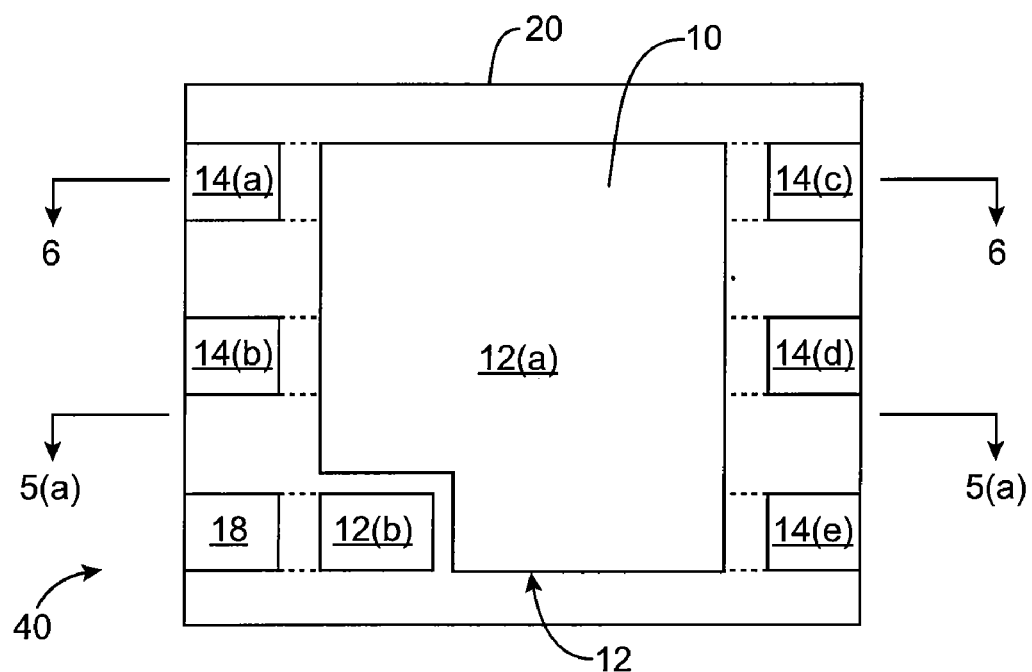
FIG. 1 shows a plan view of a substrate according to an embodiment of the invention.

FIG. 1 shows a substrate 40 according to an embodiment of the invention. The substrate 40 can support a semiconductor die (not shown) in a semiconductor die package.

The substrate 40 includes a leadframe structure 10 and a molding material 20. The term "leadframe structure" can refer to a structure that is derived from a leadframe. Leadframes can be formed by, for example, a stamping process (known in the art). Leadframes can also be formed by etching a continuous conductive sheet to form a predetermined pattern. However, if stamping is used, the leadframe may originally be one of many leadframes in an array of leadframes that are connected together by tie-bars. During the process of making a semiconductor die package, the leadframe array may be cut to separate the leadframe from other leadframes. As a result of this cutting, portions of a leadframe structure in a final semiconductor die package such as a source lead and a gate lead may be electrically and mechanically uncoupled from each other. Thus, in embodiments of the invention, a leadframe structure in a semiconductor die package may be a continuous metallic structure or a discontinuous metallic structure.

The leadframe structure 10 includes a die attach region 12. In this example, the die attach region 12 has a source attach region 12(a) and a gate attach region 12(b). When a semiconductor die (not shown) is on the die attach region 12, the source region and the gate region of a MOSFET (metal oxide semiconductor field effect transistor) would be respectively coupled to the source attach region 12(a) and the gate attach region 12(b). If the MOSFET is a vertical MOSFET (described in detail below), the drain region of the MOSFET would be on the opposite side of the semiconductor die as the source region and the gate region.

For purposes of illustration, the substrate embodiment described above has a source attach region and a gate attach region that are isolated from each other. However, in other embodiments, the substrate could comprise a drain attach region instead of or in addition to a source attach region and a gate attach region. If the semiconductor die comprises a vertical MOSFET, the surface with the drain region of the MOSFET would be coupled to and proximate the substrate, while the source and the gate regions at the other side of the semiconductor die would be distal to the substrate.

In this example, the substrate 40 has five source leads 14(a)-14(e) with corresponding source lead surfaces, and a gate lead 18 with a gate lead surface. Invisible lines show connections under the molding material 20 coupling the five source leads 14(a)-14(e) to the source attach region 12(a). Invisible lines also show the gate lead 18 coupled to the gate attach region 12(b). The gate attach region 12(b) and the source attach region 12(a) are electrically isolated from each other.

The leadframe structure 10 many comprise any suitable material, may have any suitable form, and may have any suitable thickness. Exemplary leadframe structure materials include metals such as copper, aluminum, gold, etc., and alloys thereof. The leadframe structures may also include plated layers such as plated layers of gold, chromium, silver, palladium, nickel, etc. The leadframe structure 10 may also have any suitable thickness including a thickness less than about 1 mm (e.g., less than about 0.5 mm).

The semiconductor dies that are eventually mounted on the substrate 40 may include any suitable semiconductor device. Suitable devices include vertical power transistors. Vertical power transistors include VDMOS transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces.

The molding material 20 may comprise any suitable material. Suitable molding materials include biphenyl based materials, and multi-functional cross-linked epoxy resin composite materials. As shown in FIG. 1, the leads 14(a)-14(e), 18 do not extend laterally outward past the molding material 20 so that the substrate 40 can be considered a "leadless" substrate and a package including the substrate could be considered a "leadless" package.

In some embodiments, the molding material may have a dark color (e.g., black). The source attach region 12(a), the source leads 14(a)-14(e), the gate attach region 12(b), and the gate lead 18 may comprise a metallic material (e.g., copper, aluminum) that has good contrast with the molding material 20. The good contrast makes it easier to align and deposit solder or place a semiconductor die on the source attach region 12, the source leads 14(a)-14(e), the gate attach region 12, and the gate lead 18. For example, the improved contrast makes it easier for a machine to automatically deposit solder or automatically pick and place a semiconductor die on the substrate 40. This reduces the likelihood of forming semiconductor die packages that are defective.

As noted, the die attach region 12 includes a source attach region 12(a) and a gate attach region 12(b). In a formed semiconductor die package, a source region and a gate region of a MOSFET can be at the same side of the semiconductor die in the package. The source region and the gate region in the semiconductor die can be respectively coupled to the source attach region 12(a) and the gate attach region 12(b). Solder may be used to electrically couple the semiconductor die to the source attach region 12(a) and the gate attach region 12(b).

As shown in FIG. 1, the gate lead surface of the gate lead 18 and the source lead surfaces of the source leads 14(a)-14(e) are exposed through the molding material 20. Likewise, the surface of the source attach region 12(a) and the surface of the gate attach region 12(b) are exposed through the molding material 20. In this embodiment, the outer surface of the molding material 20 and the exposed surfaces of the source attach region 12(a), the gate attach region 12(b), the gate lead 18, and the source leads 14(a)-14(e), are substantially coplanar.

Figure 2:
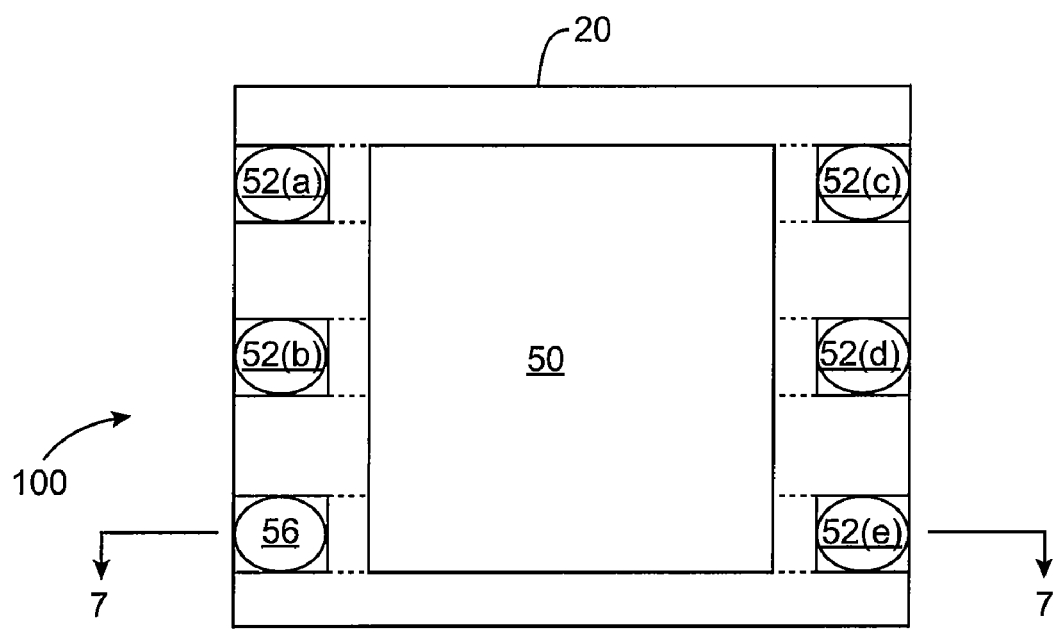
FIG. 2 shows a plan view of a semiconductor die package according to an embodiment of the invention.

FIG. 2 shows a semiconductor die package 100 using the substrate 40 shown in FIG. 1. The semiconductor die package 100 includes a semiconductor die 50 over the die attach region. Solder structures 52(a)-52(e) (e.g., solder balls) are respectively deposited on the source leads 14(a)-14(e). Another solder structure 56 is deposited on the gate lead 18. The solder structures 52(a)-52(e), 56 can be formed using any suitable process including screen printing, ball attach, pick and place processes, etc.

After depositing the solder structures 52(a)-52(e), 56 and mounting the semiconductor die 50 on the substrate 40, the semiconductor die package 100 can be flipped over and then mounted onto a circuit board.

Figure 3:
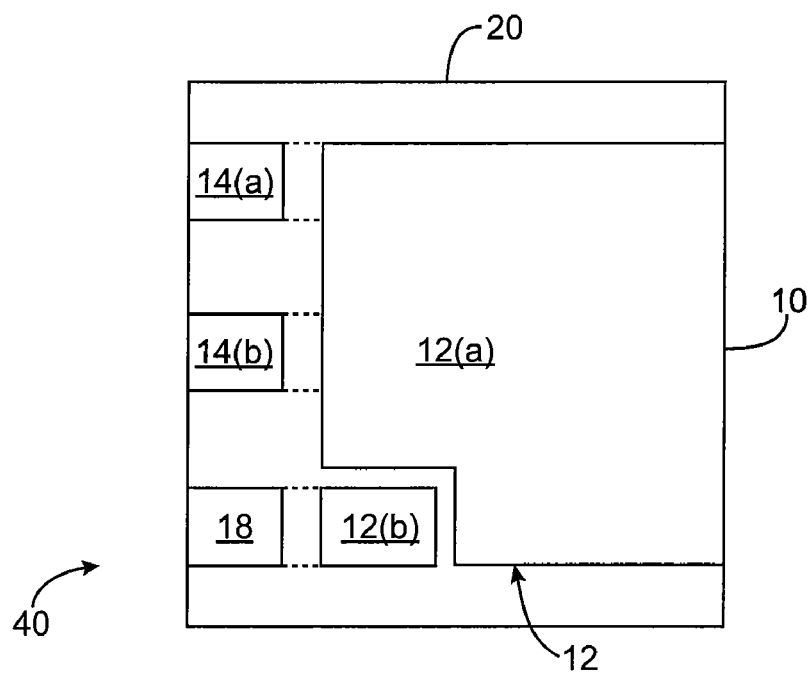
FIG. 3 shows a plan view of a substrate according to an embodiment of the invention.
Figure 4:
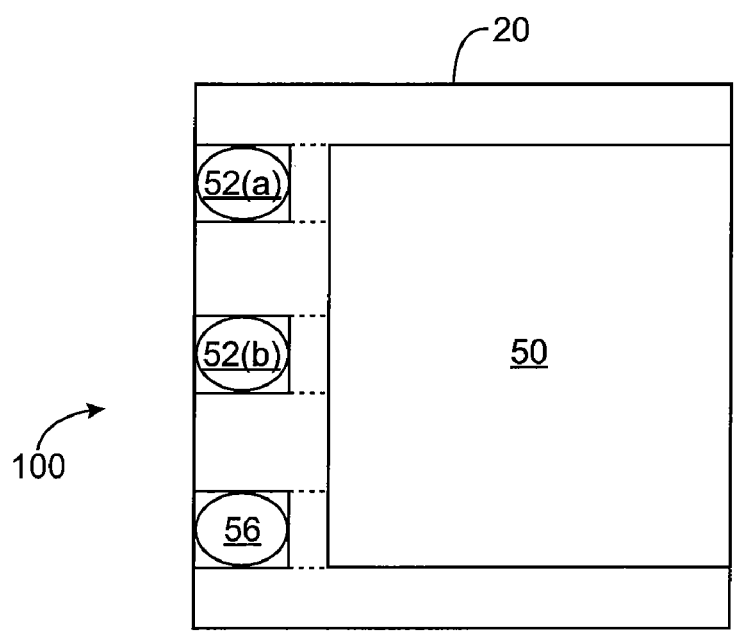
FIG. 4 shows a plan view of a semiconductor die package according to an embodiment of the invention.

FIGS. 3 and 4 respectively show a substrate and a semiconductor die package according to another embodiment of the invention. In FIGS. 1 to 4, like numerals designate like elements. The embodiments in FIGS. 3 and 4 are similar to the elements in FIGS. 1 and 2, except that in the embodiments shown in FIGS. 3 and 4, there are fewer source leads and corresponding solder structures. In comparison to the embodiments in FIGS. 1 and 2, the areas of the substrate and semiconductor die package in FIGS. 3 and 4 are smaller. As shown by the different embodiments in FIGS. 1-4, embodiments of the invention may have any suitable number of source leads and drain leads.

Figure 5A:
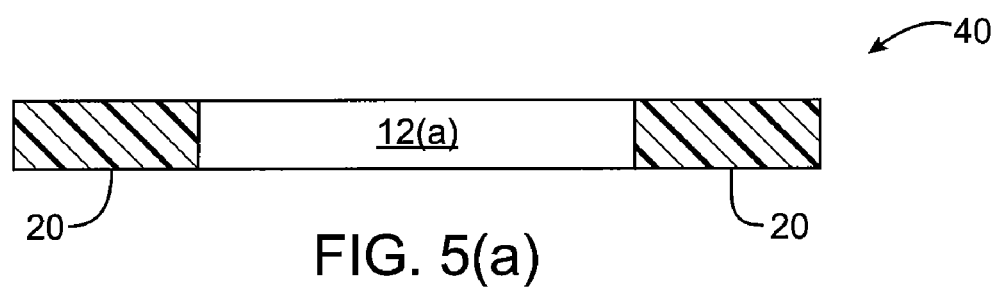
FIG. 5(a) shows a cross-sectional view of a substrate according to an embodiment of the invention along the line 5(a)-5(a) in FIG. 1.

FIG. 5(a) shows a cross-sectional view of the substrate 40 along the line 5(a)-5(a) shown in FIG. 1. FIG. 5(a) shows a substrate where the opposing major surfaces of a source attach region 12(a) are exposed through the molding material 20. In this embodiment, the thickness of the molding material 20 can be substantially equal to the thickness of the leadframe structure. Parts of the top and bottom surface of a leadframe structure can be exposed through the molding material 20.

Figure 5B:
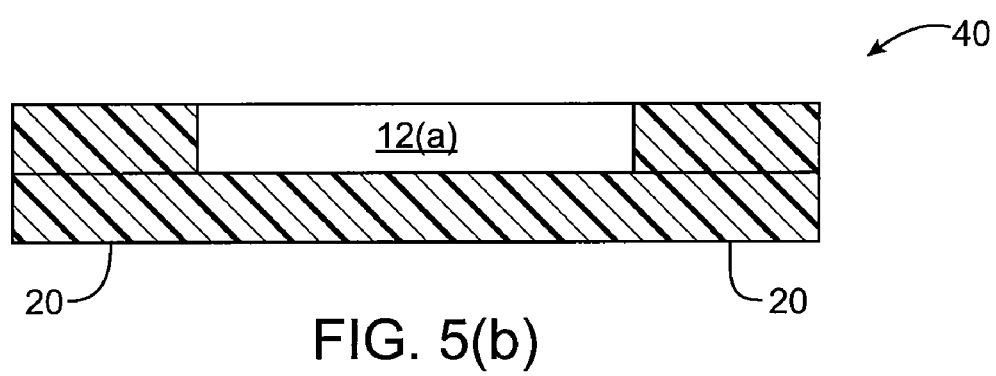
FIG. 5(b) shows a cross-sectional view of a substrate according to an embodiment of the invention.

FIG. 5(b) shows yet another embodiment of the invention. In FIG. 5(b), the source attach region 12(a) of the die attach region is shown and the molding material 20 exposes the source attach region 12(a). Unlike the embodiment shown in FIG. 5(a), the molding material 20 covers the sides and the bottom surface of the leadframe structure.

The substrate embodiment shown in FIG. 5(a) is thinner than the substrate embodiments shown in FIG. 5(b). This may be desirable if, for example, the formed semiconductor die package is to be used in a thin device such as a wireless phone or a laptop computer.

Figure 6:
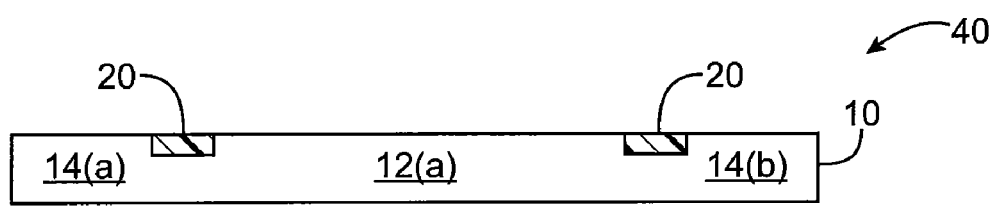
FIG. 6 shows a cross-sectional view of the substrate in FIG. 1 along the line 6-6.

FIG. 6 shows a side view of the substrate 40 shown in FIG. 1 along the line 6-6. As shown, the leadframe 10 includes a source attach region 12(a), and two source leads 14(a), 14(c). Molding material 20 is disposed in grooves in the leadframe 10. The molding material 20 in the grooves can help to selectively expose the source leads 14(a), 14(b).

Figure 7:
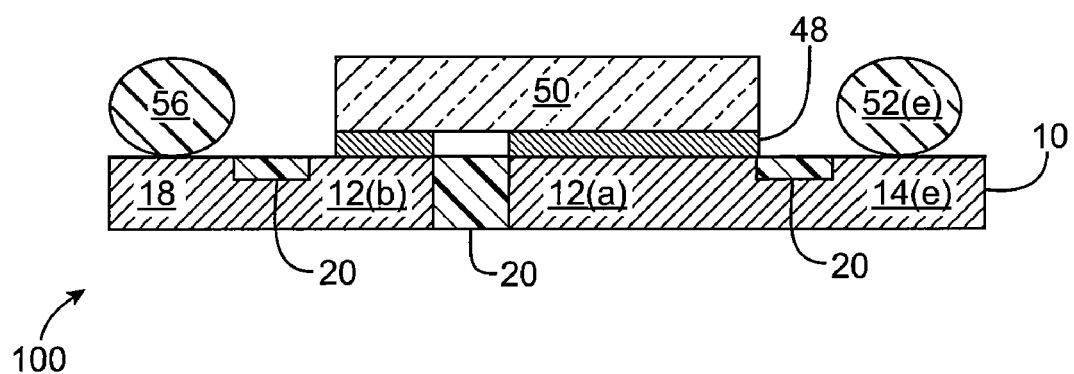
FIG. 7 is a side cross-sectional view of the semiconductor die package in FIG. 2 along the line 7-7.

FIG. 7 shows the semiconductor die package 100 shown in FIG. 2 from a side cross-sectional view along the line 7-7. The semiconductor die package 100 includes a semiconductor die 50 mounted on a source attach region 12(a) and a gate attach region 12(b) of a leadframe structure 10 through a layer of solder 48. The layer of solder 48 in this embodiment is discontinuous so the gate and source regions in the die 50 do not short out. Solder balls 52(e), 56 are respectively on the source lead 14(e) and the gate lead 18. Molding material 20 is in grooves in the leadframe structure 10 between the solder balls 52(e), 56, and the semiconductor die 50. Molding material 20 is also between the source attach region 12(a) and the gate attach region 12(b) to electrically isolate the gate current and source current passing to the semiconductor die 50.

Figure 8:
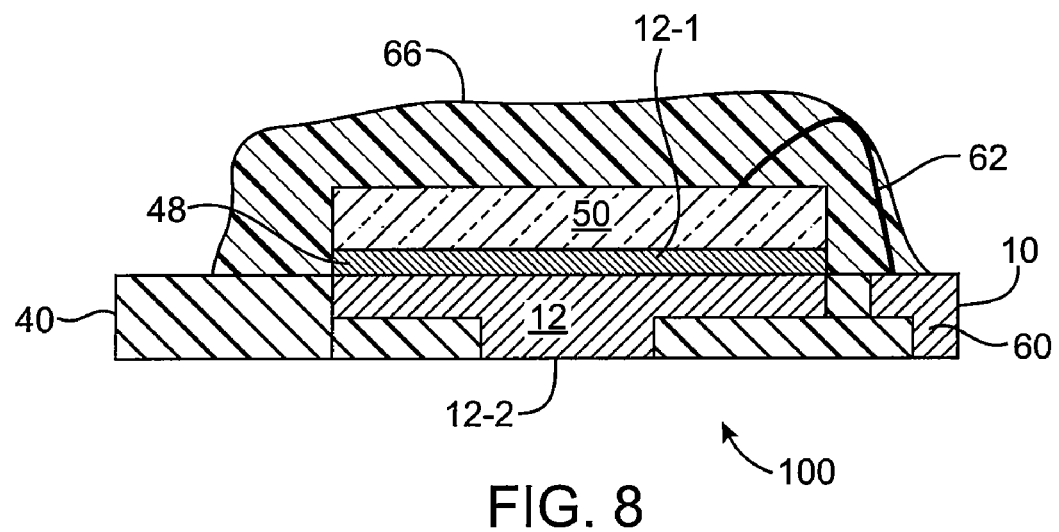
FIG. 8 is a side cross-sectional view of another semiconductor die package according to an embodiment of the invention.

FIG. 8 shows a semiconductor die package 100 according to another embodiment of the invention. The semiconductor die package 100 includes a semiconductor die 50 on a substrate 40. The semiconductor die 50 can include a source region and a gate region at the upper surface of the semiconductor die 50, and a drain region its lower surface. A wire 62 can couple, for example, the source region in the semiconductor die 50 to a source lead 60. Another wire (not shown) could couple the gate region of the semiconductor die 50 to a gate lead (not shown).

An encapsulating material 66 covers the semiconductor die 50 and the wire 62 to protect these components. In some embodiments, the encapsulating material 66 may be different than the molding material 20. Any suitable encapsulating material may be used. Suitable encapsulating materials include bi-phenyl materials, and multi-functional cross-linked epoxy resin composites.

The substrate 40 includes a leadframe 12 with a first surface 12-1 proximate to the semiconductor die 50 and a second surface 12-2 distal to the semiconductor die 50. The first surface 12-1 has a greater area than the second surface 12-2. By reducing the size of the second surface, the package 100 can be mounted on a conductive land of an appropriate size on a circuit board.

Any suitable process can form the reduced-area second surface 12-2. For example, a photolithography process can be used to print a photoresist pattern on a metallic structure such as a leadframe. A suitable etchant can then be used to etch the metal structure to the appropriate depth to form the reduced-area second surface 12-2 of the leadframe structure. Photolithography and etching processes are well known in the art.

Unlike the previous embodiments, the semiconductor die package 100 shown in FIG. 8 can be mounted on a circuit board without flipping it over. That is, when the semiconductor die package 100 is mounted on a circuit board, the surface 12-2 is closer to the circuit board than the surface 12-1.

The substrates according to embodiments of the invention (as described above and below) could be used in devices other than purely electrical devices. For example, embodiments of the invention could be used in optocoupler packages. Optocoupler packages contain at least one optical emitter device which is optically coupled to an optical receiver device through an optically transmissive medium. The optical emitter device and the optical receiver device can be on a substrate (like the ones described above). This arrangement permits the passage of information from one electrical circuit that contains the optical emitter device to another electrical circuit that contains the optical receiver device. A high degree of electrical isolation is maintained between the two circuits. Because information is passed optically across an insulating gap, the transfer is one way. For example, the optical receiver device cannot modify the operation of a circuit containing the optical emitter device. This feature is useful because, for example, the emitter may be driven by a low voltage circuit using a microprocessor or logic gates, while the output optical receiver device may be part of a high voltage DC or AC load circuit. The optical isolation also prevents damage to the input circuit caused by the relatively hostile output circuit. Examples of suitable optocoupler devices are described in U.S. patent application Ser. No. 09/944,717, which was filed on Aug. 31, 2001, and is assigned to the same assignee as the present application. This U.S. patent application is herein incorporated by reference in its entirety for all purposes.

Figure 9:
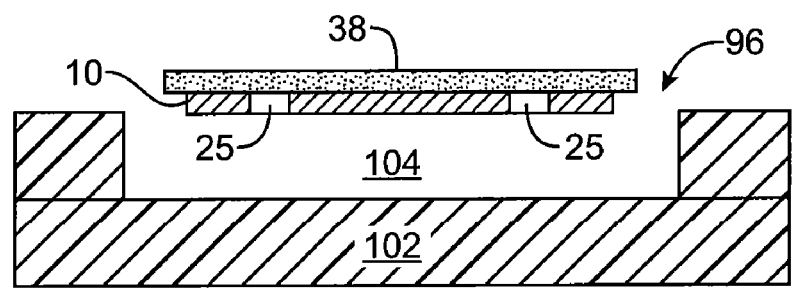
FIG. 9 shows a side cross-sectional view of a tape structure attached to a leadframe structure, as it would be placed in mold cavity in a mold.

FIG. 9 shows how the substrate can be formed in an embodiment of the invention. In this embodiment, a leadframe structure 10 (alone in the form of a leadframe or with other leadframes in an array) is adhered to an adhesive side of a tape structure 38. This combination is then placed in a mold cavity 104 of a mold 102. Molding material (in liquid or semi-liquid form) is then introduced into the molding chamber under the leadframe structure 10 as indicated by the numeral 96 and the molding material passes upward and fills the interstices 25 in the leadframe structure 10. Once the molding material solidifies, the tape structure 38, the leadframe 10, and the molding material can be removed from the mold 102. If a substrate such as the one shown in FIG. 5(a) is to be formed, excess molding material could be removed from the side of the leadframe structure 10 opposite the tape structure 38 before or after it is solidified. The tape structure 38 can then be separated from the formed substrate. The metal surfaces that were in contact with the tape structure 38 are exposed through the solidified molding material. This process can be an example of a "tape-assisted single sided molding process."

In another embodiment, instead of using a mold, it is possible to screen-print a molding material into the interstices of a leadframe structure. For example, a leadframe structure can be placed on a surface (or tape). A squeegee or other device may be used to spread molding material into the interstices of a leadframe structure. Excess molding material can then be removed (e.g., with a squeegee) if desired. The molding material can solidify and the leadframe structure can be separated from the surface. The portions of the leadframe structure that previously contacted the surface would be free of molding material and would thus be exposed through the solidified molding material. Additionally, dejunk and deflash processes (known in the art) may be performed to remove excess molding material.

After a substrate is formed, the rest of the process for forming the semiconductor package can include processes such as solder dispense, solder ball attach, flip chip die attach, and then reflowing the solder balls so that the semiconductor die is attached to the substrate.

Before or after mounting a semiconductor die to a leadframe, the leadframe structure may be partially cut to isolate the leads for testing. For example, referring to FIG. 1, the source leads 14(a)-14(e) and the gate lead 18 may be part of a single leadframe structure 10 within an array of leadframes. Initially, the leadframe structure 10 may be mechanically coupled together through an outer frame-like element through "tie-bars" (not shown) extending outward from each lead 14(a)-14(e), 18. After the substrate is formed, the tie bar (not shown) to the gate lead 18 can be cut to isolate the gate lead 18 from the source leads 14(a)-14(e). The substrate can then be electrically tested before it is separated from other substrates.

If the substrate passes testing, then the semiconductor die packages in an array of semiconductor die packages can be separated from each other in a singulation process (e.g., using a saw). A tape and a reel process, which is well known in the art, can then follow the singulation process. Advantageously, form factor dedicated tooling that trims and forms moldings is not required in embodiments of the invention.

Embodiments of the invention have a number of other advantages. First, as noted above, in embodiments of the invention, a leadframe structure is used in a substrate. Leadframe structures are inexpensive and are easy to fabricate. Thus, a substrate according to embodiments of the invention can be made quite inexpensively. For example, the cost of a substrate made according to embodiments of the invention can be reduced by about 70% or more as compared to a ceramic metallized substrate. Second, the substrates according to embodiments of the invention have high contrast between the molding material and the exposed areas of the leadframe structure. As explained in further detail above, this results in fewer defects. Third, embodiments of the invention can be made thinner than conventional semiconductor die packages and substrates. The package size of embodiments of the invention can be reduced by at least 20% over current state of the art packages. For example, the thickness of a semiconductor die package according to an embodiment of the invention can be on the order of about 0.5 mm (or less). Fourth, in embodiments of the invention, the molding process is form factor independent since it is used to construct substrates, and need not be used to completely encapsulate the semiconductor die. Fifth, the substrates and packages of embodiments of the invention can be mounted using well known "flip-chip" techniques. Sixth, in embodiments of the invention, it is possible to etch fine geometries in a leadframe structure so that the package leads and the die attach surface can be customized according to needs. Seventh, the substrates according to embodiments of the invention are mechanically quite rigid, yet flexible enough to be handled in highly automated equipment.

Also, in embodiments of the invention, it is possible to pre-mold a leadframe to form a substrate, and then this substrate can be assembled (with a die) to form a package. Advantageously, very thin leadframes can be etched or stamped. For example, one can take a copper foil about 4 mils thick, punch it or etch it to a desired pattern, and then mold it into a substrate about 6 to 8 mils thick. The formed substrate can now can be easily handled in conventional assembly equipment (e.g., a flip chip bonder). As compared to conventional plating processes, embodiments of the invention reduce processing time and increase the ease of manufacture. For example, copper plates at about 4-8 microns/min. To obtain a 4 mil thick trace of copper would normally take about 30 to 40 minutes. Embodiments of the invention take less time to produce since a pre-formed leadframe can be used to form a substrate.

The above embodiments are particularly useful and provide for superior electrical and thermal performance. However, it would be desirable to further reduce the cost of the substrate, without jeopardizing its superior electrical and thermal performance. It would also be desirable to produce a die package that satisfies JEDEC standards. In some embodiments, a leadframe structure that is about 8 to 10 mils (¹/₁₀₀₀th of an inch) is stamped. As a result of stamping, a die attach surface of the leadframe structure is downset with respect to the lead surfaces of the leads of the leadframe structure. Prior to stamping, the leadframe structure may also be etched to shape the leads or other portions of the leadframe structure. The leadframe structure is then molded with a molding material so that it is partially covered with the molding material. The molding material is used to define a solder ball (or other conductive structure) attach pattern on the leads of the leadframe structure. The molded leadframe structure can then be processed according to a typical MOSFET BGA (ball grid array) process.

Also, in some embodiments of the invention, leadframe structures with multiple downset regions can be used. In these embodiments, the molding material may isolate multiple drain terminals of different MOSFETs in a single, multi-chip package so that multiple circuit applications are possible. This reduces manufacturing costs as compared to other techniques that may use a polyimide film and stiffener for metal frame attachment.

In other embodiments of the invention, the die packages can be optionally singulated into independent packages, each package including one semiconductor die. Heat sinks can also be provided for packages including one or more dies.

Figure 10:
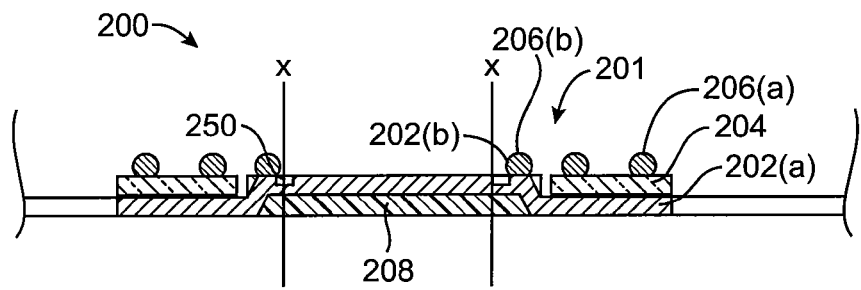
FIG. 10 shows a side cross-sectional view of an array of packages prior to singulation.

FIG. 10 shows an array of die packages 200 before singulation. The array of die packages 200 would be singulated at the lines X to thereby form separate die packages 201. Singulation can occur using any suitable cutting process (e.g., using a saw or a laser beam).

The die package 201 includes a leadframe structure 202 and a semiconductor die 204 coupled to a die attach surface 202(a) of a die attach region of the leadframe structure 202. Solder (not shown) or another suitable conductive adhesive can be used to attach the semiconductor die 204 to the leadframe structure 202.

The leadframe structure 202 may have a lead that includes a lead surface 202(b). The lead may be a drain lead coupled to a drain region of a MOSFET in the semiconductor die. In this example, the lead surface 202(b) and the die attach surface 202(a) are not coplanar with each other and lie in different planes. The lead surface 202(b) may be partially defined by a recess 250 which can be formed by etching (e.g., half etching). The die attach surface 202(a) may be characterized as being "downset" with respect to the lead surface 202(b), and they lie in different parallel planes (see planes A and B in FIG. 15). The leadframe structure 202 may have any of the characteristics and/or materials mentioned above. For example, the leadframe structure 202 can have multiple leads on one or both sides of a die attach region, and can be made of copper.

A molding material 208 is disposed around a portion of the leadframe 202. The molding material 208 may be of the type described above. In this example, the molding material 208 does not cover the die attach surface of the leadframe structure or the side of the leadframe structure opposite to the die attach surface 202(*a*). The molding material 208 also fills the recess 250 in the lead of the leadframe structure 202, to thereby define an attachment area for a conductive structure such as a solder structure.

As shown, a first array of conductive structures 206(*a*) is on the semiconductor die 204. A second array of conductive structures 206(*b*) is on lead surfaces 202(*b*) of the leads of the leadframe structure 202. The first and second arrays of conductive structures 206(*a*), 206(*b*) can comprise solder or even plated copper bumps or columns. Copper bumps are described in U.S. patent application Ser. No. 10/386,621, entitled "Wafer-Level Cu Stud Bumps", filed on Mar. 11, 2003, which is herein incorporated by reference in its entirety for all purposes. The first array of conductive structures 206 (*a*) may be electrically coupled to source and gate regions in a MOSFET in the semiconductor die 204. The second array of conductive structures 206(*b*) and the leadframe structure 202 may be electrically coupled to a drain region of the MOSFET in the semiconductor die 204.

Figure 11:
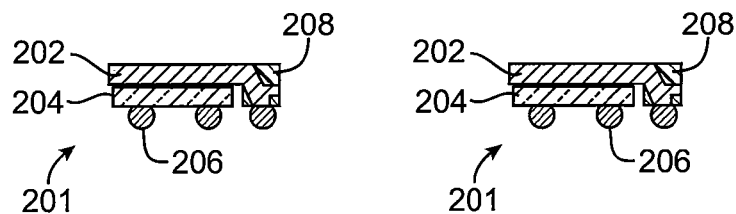
FIG. 11 shows side views of two packages that are separated after singulation.

FIG. 11 shows two die packages 201 that are formed after a singulation process is performed. As can be seen in this example, the molding material 208 is only at one side of the leadframe structure 202 and the package 201. Unlike other types of packages, the molding material 208 does not cover or encircle the entire die attach surface 202(*a*). The molding material 208 fills the recess 250 and also surrounds the lead surface 202(*b*) thereby providing a dam for the conductive structures 206(*b*).

The die packages shown in FIGS. 10 and 11 (and also the die packages described below) have a number of advantages. The offset die attach surface 202(*a*) and the lead surface 202(*b*) allows all the first plurality of conductive structures 206(*a*) and the second plurality of conductive structures 206 (*b*) to be co-planar, even through they are the same size. The packages 201 can be easily flipped over and then mounted on a circuit board. In some embodiments, an 8-mil thick leadframe structure can be used without violating JEDEC standards (i.e., the drain ball and source balls need to about approximately the same size). Also, since the molding material 208 is only at one side in the noted example, less molding material can be used thereby saving cost. Further, the first and second arrays of conductive structures can be placed on the die 204 and the leads of the leadframe structure 202 at substantially the same time and in the same process step, thereby simplifying the manufacture of the package (i.e., two steps are not needed to deposit two different types of conductive structures).

Figure 12:
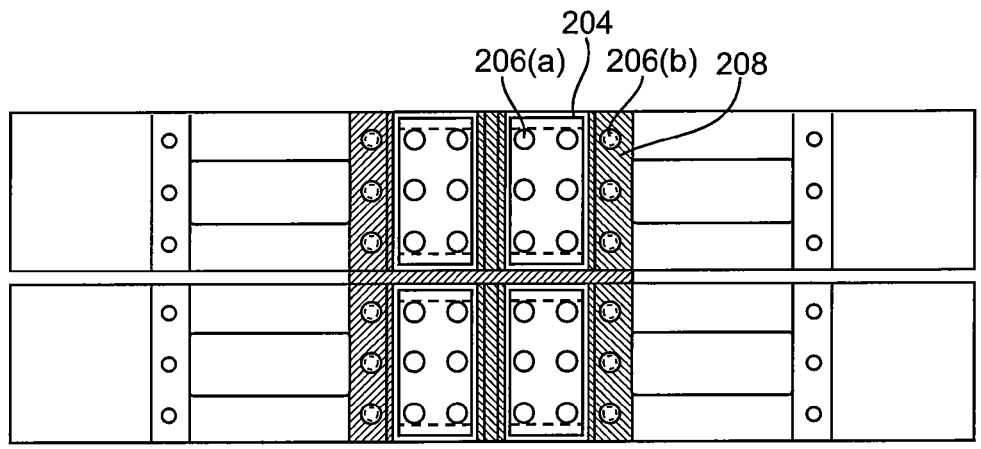
FIG. 12 shows a plan view of die packages before singulation, where each package includes multiple semiconductor dies.
Figure 13:
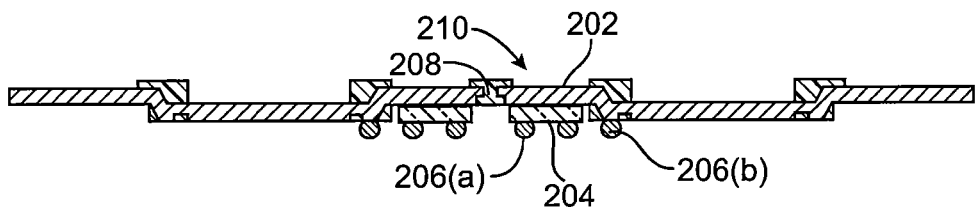
FIG. 13 shows a side, cross-sectional view of an array of packages before singulation.

FIGS. 12 and 13 show another array of die packages. In this example, there are multiple (e.g., two, four, or more) dies 204 per die package. FIG. 12 also shows a first array of conductive structures 206(*a*) and a second array of conductive structures 206(*b*). The first array of conductive structures 206(*a*) is on the semiconductor dies 204, and may serve as source and gate connections for source and gate regions in MOSFETs in the semiconductor dies 204.

Figure 14:
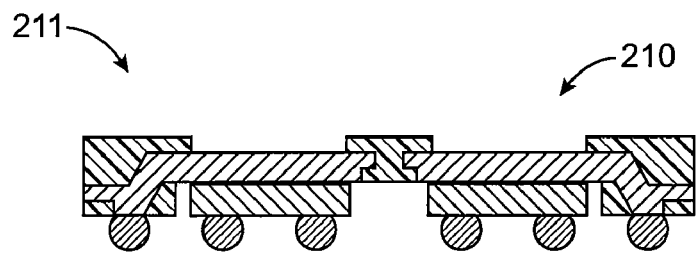
FIG. 14 shows a side cross-sectional view of a package with multiple semiconductor dies.

As shown in FIG. 13, a molding material 208 covers certain portions of the leadframe structure 202. Those portions include the sides of the die package and the middle of the die package. The molding material 208 isolates the drain regions in the different dies. Openings 210 are present in the molding material 208 and expose the surfaces of the leadframe structure 202 opposite the die attach surfaces of the leadframe structure 202. FIG. 14 shows a die package 211 including multiple dies after singulation.

Figure 15:
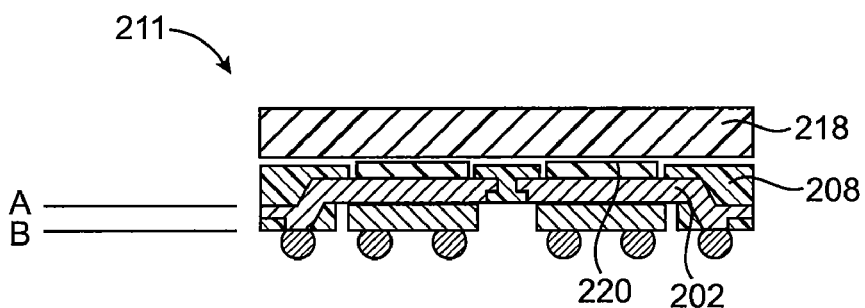
FIG. 15 shows a side cross-sectional view of a package with multiple semiconductor dies and a heat sink.

As shown in FIG. 15, a single heat sink 218 can be included in the package 211 and can be coupled to the leadframe structure 202 with solder 220 that is in the openings 210. Alternatively, a heat conductive epoxy adhesive can be used instead of solder. The heat sink 218 can be a metal plate such as a copper plate, or it can be a plate with heat dissipating fins. Alternatively, multiple heat sinks can be present in a single package (e.g., one per die and one per opening in the molding material).

The embodiments shown in FIGS. 13-15 provide for a number of additional advantages. First, multiple dies (e.g., two or four dies) can be present in a single package. Second, a single heat sink or multiple heat sinks can be added to provide for superior heat dissipation at low cost. Third, a matrix frame design can be applied and multiple die attach and simultaneous reflow processes can be performed to thus improve productivity. Fourth, embodiments of the invention are compatible copper stud bumps. Fifth, in embodiments of the invention, a ball attach process is performed simultaneously for source, gate, and drain connections. Sixth, it is possible to use bigger or smaller size dies in semiconductor die packages according to embodiments of the invention.

Figure 16:
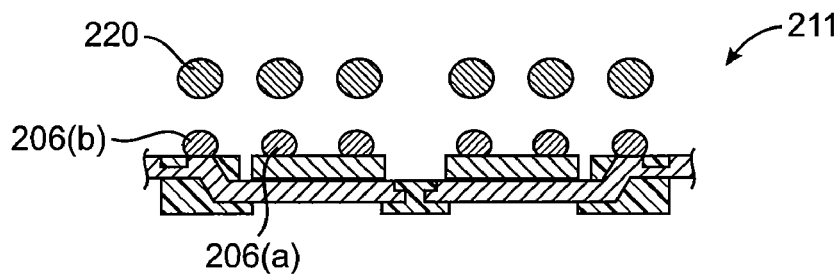
FIG. 16 shows a side cross-sectional view of a package with a second plurality of solder structures being attached to a first plurality of solder structures already on the dies and leadframe of the package.

In FIG. 16, a third array of conductive structures 220 (e.g., solder) is deposited on the first and second arrays of conductive structures 206(*a*), 206(*b*). Once this occurs, the resulting package 211 can be flipped over and mounted to a circuit substrate (such as a circuit board). In some embodiments, the first and second arrays of conductive structures 206(*a*), 206 (*b*) may comprise copper studs, copper bumps, or high melting point solder structures such as solder balls or solder columns (e.g., 95/5 Pb/Sn). The third array of conductive structures 220 may comprise low melting point solder.

Figure 17:
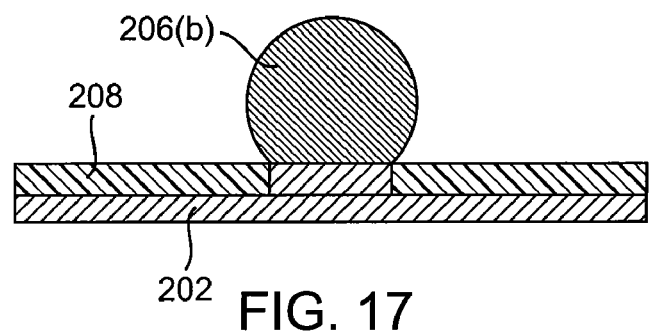
FIG. 17 shows a side-cross-sectional view of a portion of a leadframe, a molding material, and a solder ball.

FIG. 17, a solder ball 206(*b*) is attached to a lead of a leadframe structure 202. A molding material 208 surrounds the lead surface 202(*b*) of the lead. A full reflow process can be performed, thus resulting in improved solder contact. The solder ball 206(*b*) will not melt downward, because of the dam formed by the molding material 208. Solder bleeding onto the die attach surface can be eliminated, because of the molding material dam structure.

The die packages shown and described with respect to FIGS. 10-17 can be formed by any suitable method. For example, an array of leadframe structures can be obtained (e.g., including 8 mil thick leadframe structures). The leadframe structures can be etched and/or patterned using conventional etching processes. Before or after etching, the leadframe structures can be stamped or molded to form downset regions. Then, a film assisted molding process (as described above) can be used to form molded structures around predetermined areas of the leadframe structures. Tape can be used to prevent molding material from depositing on undesired areas of the leadframe structure. A tape-assisted molding process is described in detail above. A die can then be mounted on the die attach region of the leadframe structure using solder. Conductive structures such as solder balls can then be placed on the die and the leads of the leadframe structure. If the packages are in an array, they can be subjected to a singulation process to separate them from each other.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention. For example, it is understood that a substrate of the type shown in FIG. 5(b) could be used in the semiconductor die package embodiments shown in FIGS. 2 and 4.

All patent applications, patents, and publications noted above are herein incorporated by reference in their entirety for all purposes. None is admitted to be prior art.

What is claimed is:

1. A semiconductor die package comprising:
    a substrate comprising (i) a leadframe structure including a die attach region with a die attach surface and a lead having a lead surface, wherein the die attach surface and the lead surface are in different planes, and (ii) a molding material on the leadframe structure, wherein the die attach surface and the lead surface are free of the molding material;
    a semiconductor die on the die attach region; and
    conductive structures on the semiconductor die and on the lead surface, wherein the conductive structures on the semiconductor die and the lead surface lie within the same plane.

2. The semiconductor die package of claim 1 wherein the semiconductor die is electrically coupled to the die attach region.

3. The semiconductor die package of claim 1 wherein the die attach surface is downset with respect to the lead surface.

4. The semiconductor die package of claim 1 wherein the semiconductor die comprises a vertical MOSFET having a source region and a gate region at one side of the semiconductor die and a drain region at the other side of the semiconductor die.

5. The semiconductor die package of claim 1 wherein the lead is a drain lead.

6. The semiconductor die package of claim 1 wherein the leadframe structure comprises copper.

7. The semiconductor die package of claim 1 wherein a surface of the die opposite to the substrate is free of the molding material.

8. The semiconductor die package of claim 1 wherein there is no molding material directly over or directly under the die.

9. The semiconductor die package of claim 1 wherein the conductive structures comprise solder.

10. The semiconductor die package of claim 1 wherein the different planes are different parallel planes.

11. A semiconductor die package comprising:
    (a) a substrate comprising (i) a leadframe structure including a die attach region with a die attach surface and a lead having a lead surface, and (ii) a molding material, wherein the molding material is formed around the lead surface and defines a region for attachment of a conductive structure and wherein an exterior molding material surface is substantially coplanar with the lead surface; and
    (b) a semiconductor die on the die attach region,
    wherein the semiconductor die is electrically coupled to the lead, and wherein the die attach surface is downset with respect to the lead surface, wherein there is no molding material directly over or directly under the semiconductor die.

12. A semiconductor die package comprising:
    (a) a substrate comprising (i) a leadframe structure including a die attach region with a die attach surface and a lead having a lead surface, and (ii) a molding material, wherein the molding material is formed around the lead surface and defines a region for attachment of a conductive structure and wherein an exterior molding material surface is substantially coplanar with the lead surface; and
    (b) a semiconductor die on the die attach region,
    wherein the semiconductor die is electrically coupled to the lead, wherein the die attach surface is downset with respect to the lead surface, wherein the semiconductor die comprises a vertical transistor, and wherein there is no molding material directly over or directly under the die.

13. A semiconductor die package comprising:
    (a) a substrate comprising (i) a leadframe structure including a die attach region with a die attach surface and a lead having a lead surface, and (ii) a molding material, wherein the molding material is formed around the lead surface and defines a region for attachment of a conductive structure and wherein an exterior molding material surface is substantially coplanar with the lead surface; and
    (b) a semiconductor die on the die attach region,
    wherein the semiconductor die is electrically coupled to the lead, and wherein the die attach surface is downset with respect to the lead surface, and wherein the semiconductor die package further comprises conductive structures on the lead surface and a surface of the die opposite to the substrate.

14. The semiconductor die package of claim 13 wherein the conductive structures are in a single plane.

15. A semiconductor die package comprising:
    (a) a substrate comprising (i) a leadframe structure including a die attach region with a die attach surface and a lead having a lead surface, and (ii) a molding material, wherein the molding material is formed around the lead surface and defines a region for attachment of a conductive structure and wherein an exterior molding material surface is substantially coplanar with the lead surface; and
    (b) a semiconductor die on the die attach region,
    wherein the semiconductor die is electrically coupled to the lead, wherein the die attach surface is downset with respect to the lead surface, and wherein the leadframe structure has a thickness that is about 8-10 mils, and is formed from a stamping process.

* * * * *